(12) United States Patent
Gresik et al.

(10) Patent No.: US 9,051,650 B2
(45) Date of Patent: Jun. 9, 2015

(54) IN-LINE METALLIZER ASSEMBLIES AND PART-COATING CONVEYOR SYSTEMS INCORPORATING THE SAME

(71) Applicant: Marca Machinery, LLC, Gorham, ME (US)

(72) Inventors: Joseph W. Gresik, Windham, ME (US); Jeffrey J. Black, Biddeford, ME (US); Stanley Brooks, Mifflinberg, ME (US); John Shaw, Scarborough, ME (US); Larry Zuckerman, New Gloucester, ME (US)

(73) Assignee: Marca Machinery, LLC, Gorham, ME (US)

( * ) Notice: Subject to any disclaimer, the term of this patent is extended or adjusted under 35 U.S.C. 154(b) by 67 days.

(21) Appl. No.: 13/655,912

(22) Filed: Oct. 19, 2012

(65) Prior Publication Data

US 2013/0037407 A1    Feb. 14, 2013

Related U.S. Application Data

(63) Continuation-in-part of application No. 12/688,482, filed on Jan. 15, 2010.

(60) Provisional application No. 61/205,200, filed on Jan. 16, 2009.

(51) Int. Cl.
| | |
|---|---|
| C23C 14/34 | (2006.01) |
| C23C 14/56 | (2006.01) |
| C23C 14/18 | (2006.01) |
| C23C 14/20 | (2006.01) |

(52) U.S. Cl.
CPC ............... *C23C 14/56* (2013.01); *C23C 14/185* (2013.01); *C23C 14/205* (2013.01)

(58) Field of Classification Search
CPC ...... C23C 14/56; C23C 14/185; C23C 14/205
USPC ................ 204/298.2, 298.25, 298.23, 298.27
See application file for complete search history.

(56) References Cited

U.S. PATENT DOCUMENTS 5,292,419 A * 3/1994 Moses et al. ............. 204/298.28
5,683,561 A * 11/1997 Hollars et al. ............ 204/298.25
5,709,785 A    1/1998 LeBlanc, III et al.
(Continued)

FOREIGN PATENT DOCUMENTS

WO    WO0028105 A1    5/2000

OTHER PUBLICATIONS

International Search Report and Written Opinion in International Application No. PCT/US2013/065632 mailed on Jan. 7, 2014.

*Primary Examiner* — John Brayton
(74) *Attorney, Agent, or Firm* — Dinsmore & Shohl LLP

(57) ABSTRACT

In-line metalizer assemblies can include an external rotating actuator exchange that can be operable to exchange one or more parts between a conveyor system and a vacuum chamber, and an internal rotating actuator exchange within the vacuum chamber that can be operable to receive the one or more parts from the external rotating actuator exchange, transition the one or more parts to a sputter coater integrated with the vacuum chamber for metallizing, and return metalized one or more parts to the external rotating actuator exchange such that the external rotating actuator exchange can return the metalized one or more parts to the conveyor system.

17 Claims, 9 Drawing Sheets

(56) References Cited

U.S. PATENT DOCUMENTS

| | | | |
|---|---|---|---|
| 6,395,156 B1 * | 5/2002 | Hsueh et al. | 204/298.04 |
| 6,471,837 B1 * | 10/2002 | Hans et al. | 204/298.41 |
| 6,730,194 B2 * | 5/2004 | Schertler | 204/192.26 |
| 6,736,943 B1 * | 5/2004 | Scobey et al. | 204/192.12 |
| 8,741,116 B2 * | 6/2014 | Lim et al. | 204/298.26 |
| 2002/0144890 A1 | 10/2002 | Schertler | |
| 2003/0116432 A1 * | 6/2003 | Schweitzer et al. | 204/298.11 |
| 2010/0181193 A1 | 7/2010 | Parent et al. | |
| 2012/0234670 A1 | 9/2012 | Perego | |

* cited by examiner

US 9,051,650 B2

IN-LINE METALLIZER ASSEMBLIES AND PART-COATING CONVEYOR SYSTEMS INCORPORATING THE SAME

CROSS-REFERENCE TO RELATED APPLICATIONS

This patent application is a continuation-in-part of U.S. patent application Ser. No. 12/688,482 filed Jan. 15, 2010, which claims priority to Provisional Patent Application No. 61/205,200 filed Jan. 16, 2009, which is hereby incorporated by reference in its entirety.

TECHNICAL FIELD

The present specification generally relates to metallizing parts and, more specifically, to assemblies for sputter coating plastic parts in-line with conveyor systems.

BACKGROUND

Plastic and glass parts are often painted and coated with different materials to change their visual appearance. For instance, plastic parts may first receive one or more basecoats of paint or primer. Basecoats can fill in defects left over from manufacturing and handling as well as provide a more durable and adhesive surface for subsequent coatings. A topcoat may also be applied to protect the basecoat or to otherwise alter the appearance of the part. Both basecoats and topcoats can be applied to parts as they travel about a conveyor line. It can also be desirable to produce a reflective or metallic appearance by applying a reflective metal coating. The metal coating can be applied between the basecoat and the topcoat, on top of a basecoat without a topcoat, below a topcoat without a basecoat, or in any other combination of basecoats and/or topcoats. For example, a thin layer of metal can be deposited onto the surface of the part using an evaporation process such as that available with a batch metallizer. However, batch metalizes and other conventional assemblies can require the collecting and racking of large quantities of parts which can, in turn, create high cycle times for the metallizing process.

Accordingly, a need exists for alternative metallizer assemblies and conveyor systems for metallizing parts.

SUMMARY

In one embodiment, an in-line metallizer assembly includes an external rotating actuator exchange operable to exchange one or more parts between a conveyor system and a vacuum chamber, and, an internal rotating actuator exchange within the vacuum chamber operable to receive the one or more parts from the external rotating actuator exchange, transition the one or more parts to a sputter coater integrated with the vacuum chamber for metallizing, and return metalized one or more parts to the external rotating actuator exchange such that the external rotating actuator exchange can return the metalized one or more parts to the conveyor.

In another embodiment, an in-line metallizer assembly includes an external rotating actuator exchange that includes one or more actuating arms connected to a rotating pivot, the one or more actuating arms can be operable to extend from and retract towards the rotating pivot, and the rotating pivot being can be operable to rotate the external rotating actuator exchange, an internal rotating actuator exchange that includes one or more internal actuating arms connected to an internal rotating pivot, the one or more internal actuating arms can be operable to extend from and retract towards the internal rotating pivot, and the internal rotating pivot can be operable to rotate the internal rotating actuator exchange, and a vacuum chamber that includes an integrated sputter coater and houses the internal rotating actuator exchange.

In yet another embodiment, a part-coating conveyor system includes one or more paint stations, an in-line metallizer assembly including an external rotating actuator exchange and an internal rotating actuator exchange, the internal rotating actuator exchange being housed within a vacuum chamber integrated with a sputter coater, wherein the in-line metallizer assembly can be operable to continuously metalize a plurality of parts within the part-coating conveyor system, a track connecting the in-line metallizer assembly with the one or more paint stations, and one or more pallets operable to advance along the track between the one or more paint stations and the in-line metallizer assembly.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein generally relate to in-line metallizer assemblies and part-coating conveyor systems incorporating in-line metallizer assemblies. In-line metallizer assemblies generally comprise an external rotating actuator exchange and a vacuum chamber integrated with a sputter coater. The external rotating actuator exchange may be operable to exchange one or more parts from an adjacent conveyor system with one or more parts from the vacuum chamber. The vacuum chamber may also comprise an internal rotating actuator exchange operable to transition one or more parts between the external rotating actuator exchange and the sputter coater. Thus, parts traveling along the conveyor system can be removed from the conveyor system, metalized (i.e., coated with a metal film), and returned to the conveyor system for further processing. The external rotating actuator exchange and internal rotating actuator exchange can act in cooperation to allow for the metallization of parts within the sputter coater while previously metalized parts are simultaneously exchanged with non-metalized parts outside of the vacuum chamber. Such cooperation may allow for the continuous in-line metallization of parts along a conveyor system. Part-coating conveyor systems may also incorporate an in-line metallizer assembly such that a base coat, metal coat and top coat can be independently applied to parts using a single conveyor system, such as an asynchronous conveyor system. Various embodiments of the in-line metallizer assemblies and part-coating conveyor systems will be described in more detail herein.

Figure 1:
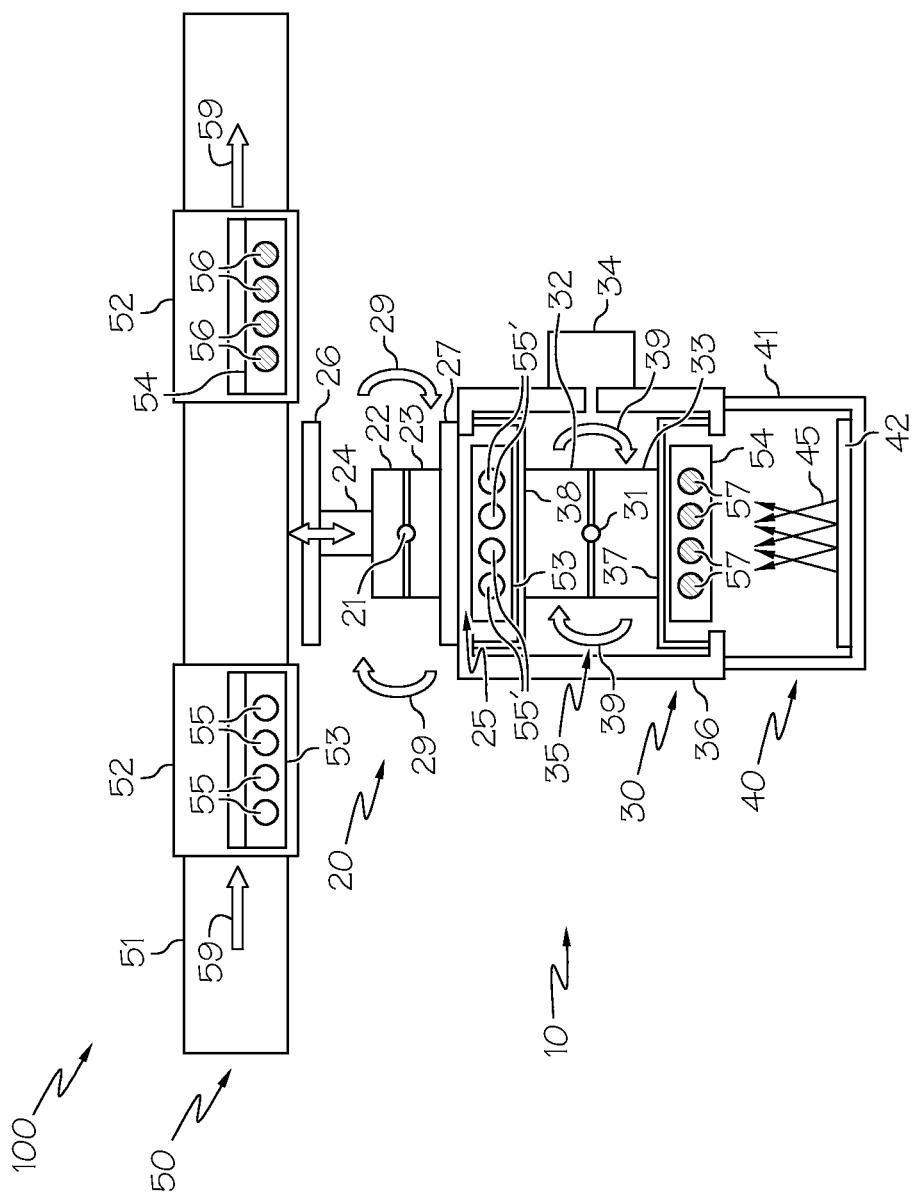
FIG. 1 depicts a schematic of an in-line metallizer assembly in cooperation with a conveyor system according to one or more embodiments shown and described herein.
Figure 2:
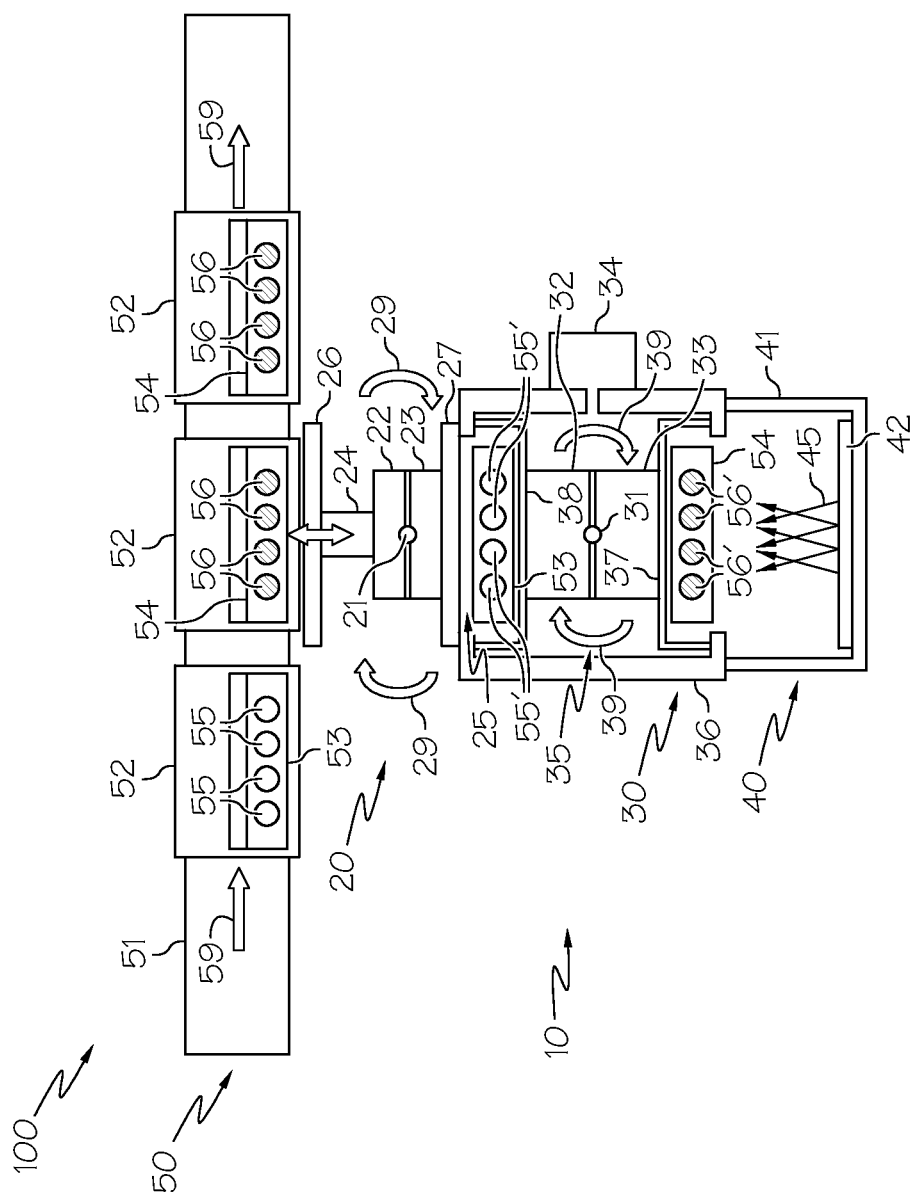
FIG. 2 depicts a schematic of an in-line metallizer assembly in cooperation with a conveyor system according to one or more embodiments shown and described herein.

Referring now to FIGS. 1 and 2, an exemplary in-line metallizer assembly 10 is depicted in cooperation with a conveyor system 50 as part of an exemplary part-coating conveyor system 100. As illustrated, and as will be discussed more fully herein, the conveyor system 50 transports parts adjacent the in-line metallizer assembly 10. Pre-metalized parts 55 are transported towards the in-line metallizer assembly 10 while metalized parts 56 are transported away from the in-line metallizer assembly 10. An external rotating actuator exchange 20 will extend and receive (i.e., pick-up) pre-metalized parts 55 from the conveyor system via its actuating arms 22,23 and external door clasp 26. The external rotating actuator exchange 20 will then retract and rotate to transport the pre-metalized parts 55 to a vacuum chamber 30. As seen in FIG. 2, this rotation may also allow for the external rotating actuator exchange 20 to simultaneously provide (i.e., drop-off) metalized parts 56 back to the conveyor system 50. Referring to FIG. 1, an internal rotating actuator exchange 35 disposed within the vacuum chamber 30 may then receive pre-metalized parts 55' when extended (as illustrated) within the vacuum chamber 30. The internal rotating actuator exchange 35 can also retract and rotate to transition pre-metalized parts 55' within the vacuum chamber 30 to a sputter coater 40. The sputter coater can then be activated such that parts 57 facing the metallizer 40 can undergo the metallizing process. As illustrated in FIG. 2, once the parts 56' facing the sputter coater 40 are fully metalized, the internal rotating actuator exchange 35 can retract and rotate to transition the metalized parts 56' back towards the external rotating actuator exchange 20. The internal rotating actuator exchange 35 can simultaneously transition new pre-metalized parts 55' within the vacuum chamber 30 to the sputter coater 40. The external rotating actuator exchange 20 may then receive and transition the metalized parts 56 back onto the conveyor system 50 to complete the metallizer cycle for a given group of parts.

The conveyor system 50 may comprise any conveyor system operable to facilitate the movement of objects (such as pallets 52, part carriers 53,54 and/or one or more parts 55,56 as will become further appreciated herein). For example, as depicted in FIGS. 1-4, the conveyor system 50 may comprise one or more conveyor belts 51 that are each operable to transport a plurality of objects simultaneously. In another embodiment, the conveyor system 50 may comprise a plurality of rollers that allow for objects to pass over the series of rollers with reduced friction. In yet another embodiment, the conveyor system 50 may comprise a guide path in which objects can drive along the guide path independent of one another. It should be appreciated that the conveyor system 50 may comprise any alternative system, or combinations thereof, such that it facilitates the movement of objects. In one specific embodiment, such as that depicted in FIGS. 1-3, the conveyor system 50 may comprise a plurality of pallets 52 operable to be transported along the conveyor belt 51. Each pallet 52 may be operable to hold a part carrier 53,54 which itself may be operable to hold one or more parts 55,56. As illustrated, part carriers carrying metalized parts 56 are identified as element 54. Part carriers carrying pre-metalized parts 55 are identified as element 53. Pallets 52 may comprise any structure operable to hold one or more part carriers 53,54 and/or one or more parts 55,56. For example, each pallet may comprise any type of tray, plate, bin, basket, container, or other type of receptacle.

One or more parts 55,56 may thereby be transported via each pallet 52 either directly or through a part carrier 53,54. Each pre-metalized part 55 may comprise any object that that can be metalized in a sputter coater 40 of the in-line metallizer assembly 10 as will become appreciated herein. For example, pre-metalized parts 55 may comprise plastic parts, glass parts or any other part in which a more metallic or reflective appearance is desired. In one specific embodiment, pre-metalized parts 55 may comprise injection molded plastic parts. Pre-metalized parts 55 may independently comprise any size, shape and configuration that allows for them to enter the vacuum chamber 30 of the in-line metallizer assembly 10. Part carriers 53,54 may comprise any apparatus operable to support one or more parts 55,56 throughout the metallizing process. For example, part carriers may comprise a plurality of vertical pins in which each individual part 55,56 may be supported by an individual pin. In another embodiment, part carriers 53,54 may alternatively or additional comprise any other support structure such as support stands, seats, platforms or stages. In one specific embodiment, part carriers 53,54 may be operable to rotate each individual part 55,56. For example where a part 55,56 on a part carrier 53,54 passes by one or more fixed spray guns (such as those that apply paint or other coating to the part), the part carrier 53,54 may rotate the parts 55,56 such that paint may be applied to all areas of the parts 55,56 by a single gun. Such an embodiment may also allow for the metallizing of the entire part 55,56 when the part is placed in front of a sputter coater 40 as will become appreciated herein. The part carriers 53,54 and their operation in the in-line metallizer assembly 10 will be described in greater detail below.

Still referring to FIGS. 1 and 2, the pallets 52 holding one or more part carriers 53,54 with one or more parts 55,56 can traverse along the conveyor belt 51 of the conveyor system 50 in a first conveyor direction 59. The first conveyor direction 59 may be any direction adjacent to the in-line metallizer assembly 10. More specifically, the first conveyor direction 59 may be any direction adjacent the in-line metallizer assembly that allows for an external rotating actuator exchange 20 to pick up part carriers 53,54 and/or individual parts 55,56 from the conveyor system 50. The first conveyor direction 59 may comprise a linear direction tangential to the in-line metallizer assembly 10 (such as that depicted in FIG. 1), may comprise an arced direction that passes around the in-line metallizer assembly 10, or may comprise any other direction or path that allows for the external rotating actuator exchange 20 to pick up part carriers 53,54 and/or individual parts 55,56. In one embodiment, the conveyor belt 51 may further be operable to traverse in a second conveyor direction opposite the first conveyor direction. Such an embodiment may allow pallets 52 to reverse along a conveyor system 50 to receive a metal coating.

The in-line metallizer assembly 10 may be disposed adjacent the conveyor system 50 and may generally comprise an external rotating actuator exchange 20, a vacuum chamber 30 with an internal rotating actuator exchange 35, and a sputter coater 40 integrated with the vacuum chamber 30. The external rotating actuator exchange 20 may comprise any apparatus operable to exchange one or more parts between the conveyor system 50 and the vacuum chamber 30. Specifically, the external rotating actuator exchange 20 may comprise an external rotating pivot 21 connected to a plurality of actuating arms 22,23,24. The rotating pivot may comprise any device operable to rotate the external rotating actuator exchange in an external rotating direction 29. The rotating direction 29 can comprise a clockwise direction, a counterclockwise direction or a combination of both (such as where the external rotating actuator exchange 20 first rotates in a clockwise direction before retracing its path in a counterclockwise direction). In one embodiment, the rotating pivot 21 may comprise a swivel or rod connected to a rotational drive source. The rotational drive source may be operable to turn the rotating pivot 21 to facilitate the rotation of the external rotating actuator exchange 20 in the external rotating direction 29. The rotational drive source may comprise any type of motor, engine, pneumatic apparatus and/or alternative source for power that is operable to rotate the external rotating actuator exchange 20 when the external rotating actuator exchange 20 is supporting one or more part carriers 53,54 and/or individual parts 55,56.

The plurality of actuating arms 22,23,24 connected to the rotating pivot 21 may each comprise any device operable to extend from and retract towards the rotating pivot 21. For example, as illustrated in FIGS. 1 and 2, in one embodiment, two or more actuating arms 22,24 may connect and extend from one side of the rotating pivot 21. In such an embodiment, the two or more actuating arms 22,24 may comprise a scissor-type cooperation wherein the two or more actuating arms 22,24 may extend and retract in length by collapsing and expanding in height respectively. In another embodiment, also as illustrated in FIGS. 1 and 2, a single actuating arm 23 may connect to the rotating pivot 21. In such an embodiment, the single actuating arm 23 may comprise an oscillating arm that may retract within itself, or may comprise a rigid arm that is driven away from and in towards the rotating pivot 21 via a ball screw. It should be appreciated that the actuating arms 22,23,24 may comprise any other alternative or additional configuration operable to extend from and retract towards the rotating pivot 21. The actuating arms 22,23,24 may be connected directly to the rotating pivot 21 or may be indirectly connected to the rotating pivot 21 through additional, arms, levers and/or other supports. Furthermore, similar to the rotating pivot 21, the extension and retraction of the actuating arms 22,23,24 may be powered by a lateral drive source operable to extend and retract the actuating arms 22,23,24 when the external rotating actuator exchange 20 is supporting one or more part carriers 53,54 and/or individual parts 55,56. The lateral drive force may further be operable to selectively extend or retract individual actuating arms 22,23,24. For example, where the actuating arm facing the vacuum 30 (actuator arm 23 in FIG. 1) is required to maintain its extension, the other actuating arms (actuating arms 22,23 in FIG. 1) may nonetheless be independently extended and retracted to pick up or drop of part carriers 53,54 and/or individual parts 55,56 from the conveyor system 50. In addition, the lateral drive source and the rotational drive source may comprise a single drive source, or may comprise a plurality of drive sources wherein each drive source can operate independent of the other.

Still referring to the external rotating actuator exchange 20 of the in-line metallizer assembly 10 illustrated in FIGS. 1 and 2, an external door clasp may be connected to each of the one or more actuating arms 22,23,24 distal the rotating pivot 21. For example, as seen in FIG. 1, a first external door clasp 26 and a second external door clasp 27 may be connected to the actuating arms 22,23,24 distal the rotating pivot 21. The first external door clasp 26 and second external door clasp 27 may comprise any device operable to both releasably engage one or more part carriers 53,54 (and/or individual parts 55,56) from the conveyor system 50 as well as provide a temporary vacuum seal around the entry port 25 of the vacuum chamber 30. As used herein "vacuum seal" refers to a seal that allows for an enclosed area to maintain a pressure lower than the pressure outside of the enclosed area. In one embodiment, the first external door clasp 26 and second external door clasp 27 may comprise a door with robotic grips operable to open and close about the one or more part carriers 53,54 and/or parts 55,56. In such an embodiment, the robotic grips may maintain sufficient pressure when closed to facilitate transportation of the one or more part carriers 53,54 and/or parts 55,56. In another embodiment, the first external door clasp 26 and second external door clasp 27 may comprise a flat plate (such as aluminum, iron or steel) with one or more pins or protrusions operable to engage receiving holes in the part carriers 53,54 and/or parts 55,56. In such an embodiment, the first external door clasp and second external door clasp may enter the receiving holes about the part carriers 53,54 and/or parts 55,56 when the actuating arms 22,23,24 are extended from the rotating pivot 21. Likewise, the first external door clasp and second external door clasp may exit the receiving holes about the part carriers 53,54 and/or parts 55,56 when the actuating arms 22,23,24 are retracted towards the rotating pivot 21. The first external door clasp 26 and the second external door clasp 27 may comprise the same type of device, or may each comprise a unique type of device.

As discussed above, the first external door clasp 26 and second external door clasp 27 can further be operable to provide a temporary vacuum seal around the entry port 25 of the vacuum chamber 30 to maintain vacuum pressure as will become more appreciated herein. Specifically, both the first external door clasp 26 and second external door clasp 27 may comprise sufficient size to encapsulate the entry port 25 of the vacuum chamber 30. In one embodiment, the first external door clasp 26 and second external door clasp 27 and/or the vacuum chamber walls may further comprise a periphery sealant to assist in providing a vacuum seal between the vacuum chamber 30 and one of the external door clasps 26,27. In one embodiment, the periphery sealant may comprise a rubber protrusion such as an o-ring. In such an embodiment, the vacuum chamber 30 and/or the first external door clasp 26 and second external door clasp 27 may comprise a receiving well to receive the o-ring, or the o-ring may be directly disposed between the flat surfaces of the vacuum chamber walls 36 and one of the external door clasps 26,27.

The vacuum chamber 30 of the in-line metallizer assembly 10 may be disposed adjacent the external rotating actuator exchange 10 and may comprise any enclosure operable to maintain vacuum pressure and house an internal rotating actuator exchange 35. As used herein "vacuum pressure" refers to any pressure internal an enclosure that is lower than the pressure external the enclosure. The vacuum chamber 30 can therefore, for example, comprise one or more vacuum pumps 34 connected to one or more vacuum chamber walls 36. The vacuum pump(s) 34 may be able to pump air out from the enclosure formed by the vacuum chamber walls 36 such that the enclosure possesses a vacuum pressure. The vacuum pressure may comprise any pressure less than that outside of the vacuum chamber 30 and sufficient to enable the metallizing of parts within the sputter coater 40. For example, in one embodiment the vacuum pump(s) 34 may be able to lower the pressure in the sputter coater 40 to a pressure from about 5 torr to about 10 torr (i.e., about 6.7 millibar to about 13.3 millibar) or to a pressure as low as about 0.008 ton (i.e., about 0.01 millibar).

The internal rotating actuator exchange 35 may comprise any apparatus operable to receive one or more parts from the external rotating actuator exchange 20, transition the one or more parts to the sputter coater 40 for metallizing, and transition the metalized one or more parts back to the external rotating actuator exchange 35. The internal rotating actuator exchange 35 may comprise an overall structure similar to the external rotating actuator exchange. Specifically, the internal rotating actuator exchange may comprise an internal rotating pivot 31 and internal actuating arms 32,32 connected (either directly or indirectly) to the internal rotating pivot 31. The internal rotating pivot 31 may comprise any device operable to rotate the internal rotating actuator exchange 35 in an internal rotating direction 39. The internal rotating direction 39 can comprise a clockwise direction, a counterclockwise direction or a combination of both (such as where the internal rotating actuator exchange 35 first rotates in a clockwise direction before retracing its path in a counterclockwise direction). In one embodiment, the internal rotating pivot 31 may comprise a swivel or rod connected to an internal rotational drive source. The internal rotational drive source may be operable to turn the internal rotating pivot 31 to facilitate the rotation of the internal rotating actuator exchange 35 in the internal rotating direction 39. The internal rotational drive source may comprise any type of motor, engine, pneumatic apparatus and/or alternative source for power that is operable to rotate the internal rotating actuator exchange 35 when the internal rotating actuator exchange 35 is supporting one or more part carriers 53,54 and/or parts 55,56 as received from the external rotating actuator exchange 20.

The internal actuating arms 32,33 connected to the internal rotating pivot 31 may each comprise any device operable to extend from and retract towards the internal rotating pivot 31. As discussed above with reference to the actuating arms 22,23,24 of the external rotating actuator exchange 20, single internal actuating arms 32,33 may connect to the internal rotating pivot 31 (as illustrated in FIG. 1) or multiple internal actuating arms may connect to the internal rotating pivot 31. The internal actuating arms 32,33 may be connected directly to the rotating pivot 31 or may be indirectly connected to the internal rotating pivot 31 through additional, arms, levers and/or other supports. Furthermore, similar to the internal rotating pivot 31, the extension and retraction of the internal actuating arms 32,33 may be powered by an internal lateral drive source operable to extend and retract the internal actuating arms 32,33 when the internal rotating actuator exchange 35 is supporting one or more part carriers 53,54 and/or parts 55,56 as received from the external rotating actuator exchange 20. The internal lateral drive source and the internal rotational drive source may comprise a single drive source, or may comprise a plurality of drive sources wherein each drive source can operate independent of one another. The internal lateral drive source may further be operable to provide enough force to the internal actuating arms to maintain vacuum pressure as will become further appreciated herein.

Furthermore, the internal lateral drive force may also be operable to selectively extend or retract individual internal actuating arms 32,32 independent from one another.

Figure 3:
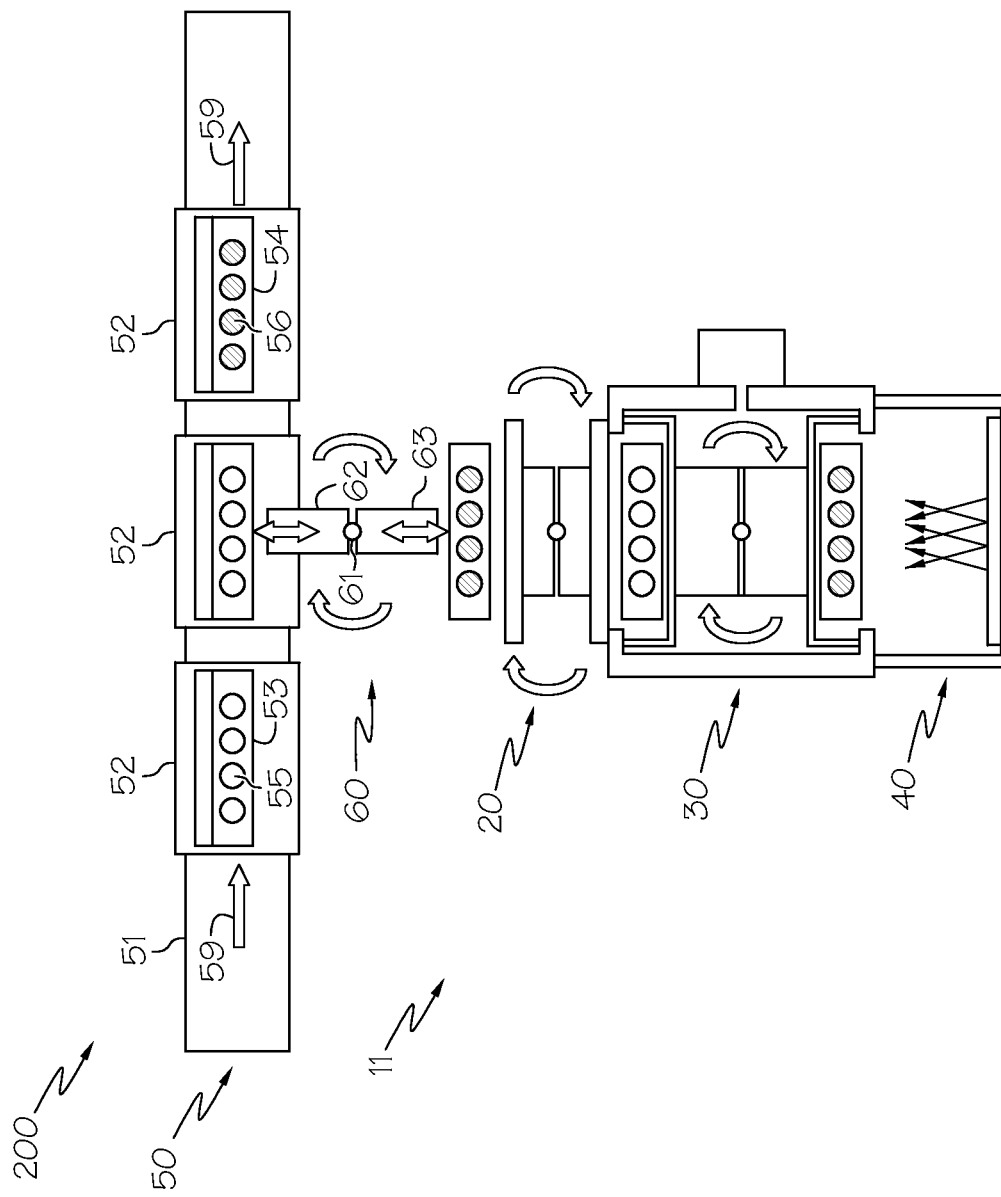
FIG. 3 depicts a schematic of another in-line metallizer assembly in cooperation with a conveyor system according to one or more embodiments shown and described herein.

Still referring to the internal rotating actuator exchange 35 in the vacuum chamber 30, an internal door clasp may be connected to each of the one or more internal actuating arms 32,33 distal the internal rotating pivot 31. For example, as illustrated in FIGS. 1-3, a first internal door clasp 37 and a second internal door clasp 38 may be connected to the internal actuating arms 32,33 distal the internal rotating pivot 31. The first internal door clasp 37 and second internal door clasp 38 may comprise any device operable to both hold one or more part carriers 53,54 (and/or individual parts 55,56) as received from the external rotating actuator exchange 20 as well as be sealed against the vacuum chamber 30 to maintain vacuum pressure within the vacuum chamber 30 and/or the sputter coater 40. For example, in one embodiment, the first internal door clasp 37 and second internal door clasp 38 may comprise box-like receptacles having one open side (i.e., the side that faces the entry port 25 or the sputter coater 40). In such an embodiment the part carriers 53,54 and/or parts 55,56 may be placed in the first internal door clasp by the external door clasps 26,27 of the external rotating actuator exchange 20. In another embodiment, the first internal door clasp 37 and second internal door clasp 38 may comprise one or more pins or protrusions operable to engage receiving holes in the part carriers 53,54 and/or parts 55,56. In such an embodiment, the first internal door clasp 37 and second internal door clasp 38 may enter the receiving holes about the part carriers 53,54 and/or parts 55,56 when the internal actuating arms 32,33 are extended from the internal rotating pivot 31. Likewise, the first internal door clasp 37 and second internal door clasp 38 may exit the receiving holes about the part carriers 53,54 and/or parts 55,56 when the internal actuating arms 32,33 are retracted towards the internal rotating pivot 31. In yet another embodiment, the external door clasps 26,27 may be operable to mate with the internal door clasps 37,38 such that actuation of an external door clasp 26,27 drives actuation of an internal door clasp 37,38 when mated. Such an embodiment may allow for controlled actuation of the internal door clasps 37,38 despite the vacuum pressure they experience. The first internal door clasp 37 and second internal door clasp 38 may comprise the same type of device, or may each comprise a unique type of device.

As discussed above, the first internal door clasp 37 and second internal door clasp 38 can further be operable to be sealed against the vacuum chamber 30 to maintain vacuum pressure within the vacuum chamber 30 and/or the sputter coater 40. Specifically, both the first internal door clasp 37 and second internal door clasp 38 may comprise sufficient size to encapsulate the entry port of the vacuum chamber 30. When an internal door clasp 37,38 is pushed against the vacuum chamber wall 36 about the entry port 25, the vacuum pressure within the vacuum chamber 30 will pull on the internal door clasp if an external door clasp 26,27 is not covering the exterior of the entry port 25. Thus, the force provided by the internal actuating arms and the internal lateral drive source must be sufficient to withstand the force from the external pressure such that the vacuum chamber 30 can maintain vacuum pressure. In one embodiment, the first internal door clasp 37 and second internal door clasp 38 may further comprise a periphery sealant to assist in providing a vacuum seal between the vacuum chamber 30 and one of the internal door clasps 37,38. In one embodiment, the periphery sealant may comprise a rubber protrusion such as an o-ring. In such an embodiment, the vacuum chamber 30 may comprise a receiving well that the o-ring fits into, or the o-ring may be disposed directly between the flat surfaces of the vacuum chamber 30 and one of the internal door clasps 37,38.

Still referring to FIGS. 1 and 2, a sputter coater 40 may further be integrated with the vacuum chamber 30. The sputter coater 40 may comprise any device operable for applying a metal coating to parts within the vacuum chamber 30. For example, as illustrated in FIGS. 1-3 the sputter coater 40 may comprise one or more cathodes 42 comprising the source material (and more specifically the metal) to be deposited onto the parts. When in operation, the sputtered metal 45 will form a film about the parts 56 such that the parts 56 are metalized and therefore possess a metallic or reflective finish. The sputtered metal can comprise any material operable to be sputtered onto the surface of the parts such as pure metals, alloys or other materials. The sputter coater can be completely disposed within the vacuum chamber 30, or, as illustrated in FIGS. 1-3, the sputter coater walls 41 of the sputter coater 40 may abut against the vacuum chamber walls 36 of the vacuum chamber 30 such that a vacuum pressure is present in the sputter coater 40 as maintained by the vacuum pump(s) 34. In one embodiment, the pressure in the sputter coater 40 may be greater than the pressure in the vacuum chamber 30 such that a pressure gradient exists between the two causing air to flow from the sputter coater 40 to the vacuum chamber 30. Such an embodiment may allow for any gas injected by (or otherwise present in) the sputter coater 40 to flow from the sputter coater 40 to the vacuum chamber 30. Such gases may comprise argon or other inert gases (for example, when the sputter coater 40 injects argon during the sputtering process), water vapor, air or any other injected or residual gas. In another embodiment, a plurality of sputter coaters 40 may be integrated with the vacuum chamber 30 such that a plurality of parts can be metalized in different sputter coaters 40 simultaneously, sequentially or in any other order or combination.

The in-line metallizer will now be explained through an exemplary method of operation. With reference to FIGS. 1 and 2, a plurality of parts (pre-metalized parts are identified as 55 and metalized parts are identified as 56) may be carried by part carriers (part carriers carrying pre-metalized parts 55 are identified as 53 and part carriers carrying metalized parts 56 are identified as 54). Each part carrier 53 is initially loaded onto its own pallet 52 and transported along the conveyor system 50 in the first conveyor direction 59. Once the pallet 52 reaches the in-line metallizer assembly 10, one or more actuating arms 22,24 of the external rotating actuator exchange 10 extend such that the part carrier 53 is received (e.g., picked up) from the pallet 52 by the first door clasp 26. Once the part carrier 53 is secured by the first external door clasp 26, the actuating arms 22,24 retract and the rotating pivot 21 rotates the external rotating actuator exchange 20 in the external rotating direction 29 such that the part carrier 53 held by the first door clasp 26 now faces the entry port 25 of the vacuum chamber 30.

Within the vacuum chamber 30, the first internal door clasp 38 is already against the vacuum chamber walls 36 so that the vacuum chamber does not experience an increase in pressure from the outside air. The actuating arms 22,24 supporting the first external door clasp 26 are extended so that the first external door clasp 26 is pushed against the vacuum chamber walls 36 and the part carrier 53 is passed off to the first internal door clasp 37 of the internal rotating actuator exchange 35. While the first external door clasp 26 remains against the vacuum chamber walls (to ensure vacuum pressure is maintained inside the vacuum chamber 30), the internal actuating arms 32,33 of the internal rotating actuator exchange 35 retract so that the first internal door clasp 37 (and second internal door clasp 38) can be rotated via the internal rotating pivot 31. Specifically, the first internal door clasp 37 is rotated such that the part carrier 53 is now facing the sputter coater 40, and part carrier 54 carrying just metalized parts 56 faces the first external door clasp 26 of the external rotating actuator exchange 20. The internal actuating arms 32,34 are then extended so that the part carrier 53 with pre-metalized parts 55 is pushed towards the sputter coater 40 for metallizing. Likewise, second internal door clasp 38 now holding the part carrier 54 with metalized parts 56 is pushed against the vacuum chamber walls 36 around the entry port 25 such that it faces the first external door clasp 26 of the external rotating actuator exchange 20. While the parts 57 are being metalized via the sputter coater 40, the second internal door clasp 38 remains against the vacuum chamber walls 36 while the first external door clasp 26 (of the external rotating actuator exchange 20) receives the part carrier 54 from the second internal door clasp 38, retracts its actuating arms 22,23,24 with the part carrier 54, rotates via its rotating pivot 21, extends its actuating arms 22,23,24 and provides the now metalized parts 56 on the part carrier 54 to a waiting pallet 52.

By possessing at least two actuating arms, each with its own external door clasp, the external rotating actuator exchange 20 can simultaneously receive one or more parts from the internal rotating actuator exchange 35 and receive one or more parts from the conveyor system 50 (i.e. from a pallet 52). Likewise, the external rotating actuator exchange 20 can also simultaneously provide one or more parts to the internal rotating actuator exchange 35 and provide one or more parts to the conveyor system 50 (i.e., to a pallet 52).

Referring now to FIG. 3, an alternative in-line metallizer assembly 11 is illustrated. Similar to FIG. 1, the in-line metallizer assembly 11 of FIG. 2 generally comprises an external rotating actuator exchange 20, a vacuum chamber 30 and a sputter coater 40. However, the in-line metallizer assembly 11 further comprises an additional transfer exchange 60 for transferring the pallets 52, part carriers 53,54 and/or parts 55,56 from the conveyor system 50 to the external rotating actuator exchange 20. More specifically, the transfer exchange 60 may comprise a transfer rotating pivot 61 and or one or more transfer actuating arms 62,63. The transfer exchange 60 may thereby be configured to transport pallets 52, part carriers 53,54 and/or parts 55,56 between the conveyor and the external rotating actuator exchange. In one embodiment, the transfer exchange 60 operates in a similar manner as the external rotating actuator exchange (wherein the transfer actuating arms 62,63 would repeatedly be retracted, rotated and extended). In another embodiment, the transfer exchange 60 may simply transport individual pallets 52, part carriers 53,54 and/or parts 55,56 in a linear manner between the conveyor and the external rotating actuator exchange 20. It should be appreciated that the transfer exchange 60 may alternatively or additionally embody any other transfer mechanism and may thereby provide additional flexibility in the location of the remaining elements of the in-line metallizer assembly 11 with respect to the conveyor system 50.

Figure 4:
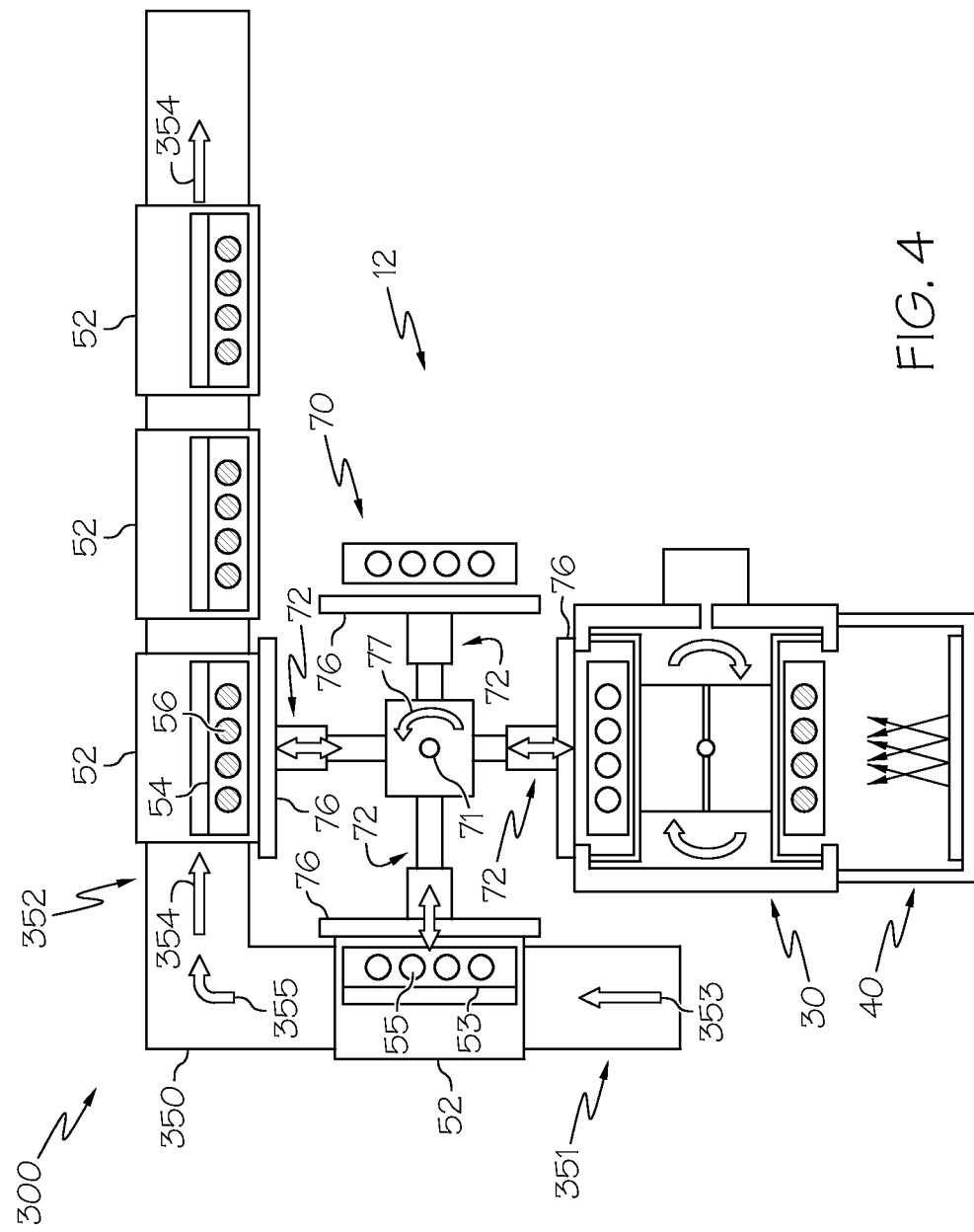
FIG. 4 depicts a schematic of yet another in-line metallizer assembly in cooperation with a conveyor system according to one or more embodiments shown and described herein.

Referring now to FIG. 4, yet another in-line metallizer assembly 12 is illustrated. Similar to FIG. 1, the in-line metallizer assembly of FIG. 3 comprises a vacuum chamber 30 with an integrated sputter coater 40 adjacent a conveyor 350. However, the in-line metallizer assembly 12 further comprises an external rotating actuator multi-exchange 70 for transferring multiple part carriers 53,54 and/or parts 55,56 between the conveyor 350 and the vacuum chamber 30. In such an embodiment, the conveyor 350 may be used to transfer part carriers 53,54 and/or parts 55,56 as described above.

However, the conveyor belt(s) 351,352 of the conveyor 350 may travel in both a first conveyor direction 353 and a second conveyor direction 354 merged by a conveyor transition 355 (such as a bend, corner or other mechanism for changing the direction of pallets 52, part carriers 53,54 and/or parts 55,56). Both the first conveyor direction 353 and the second conveyor direction 354 may pass adjacent the external rotating actuator multi-exchange 70.

The external rotating actuator multi-exchange 70 may comprise an external rotating pivot 71 and a plurality of external actuating arms 72 each having an external door clasp 76 attached thereto. The external rotating actuator multi-exchange 70 may be operable to rotate in a rotating direction 77 to transition between receiving pre-metalized parts 55 from the conveyor 350 and providing metalized parts 56 back onto the conveyor 350. The external rotating actuator multi-exchange 70 may specifically be operable to simultaneously receive a new part carrier 53 from the conveyor 350, receive or provide a part carrier 53,54 to or from the vacuum chamber 30, and provide part carriers 54 to the conveyor 350. Such an embodiment may accommodate faster cycle times by the sputter coater 40 by simultaneously picking up and dropping off part carriers 53,54 on the conveyor 350 as opposed to sequentially providing (i.e., dropping into the pallet 52) part carriers 54 and then receiving new part carriers 53.

Figure 5:
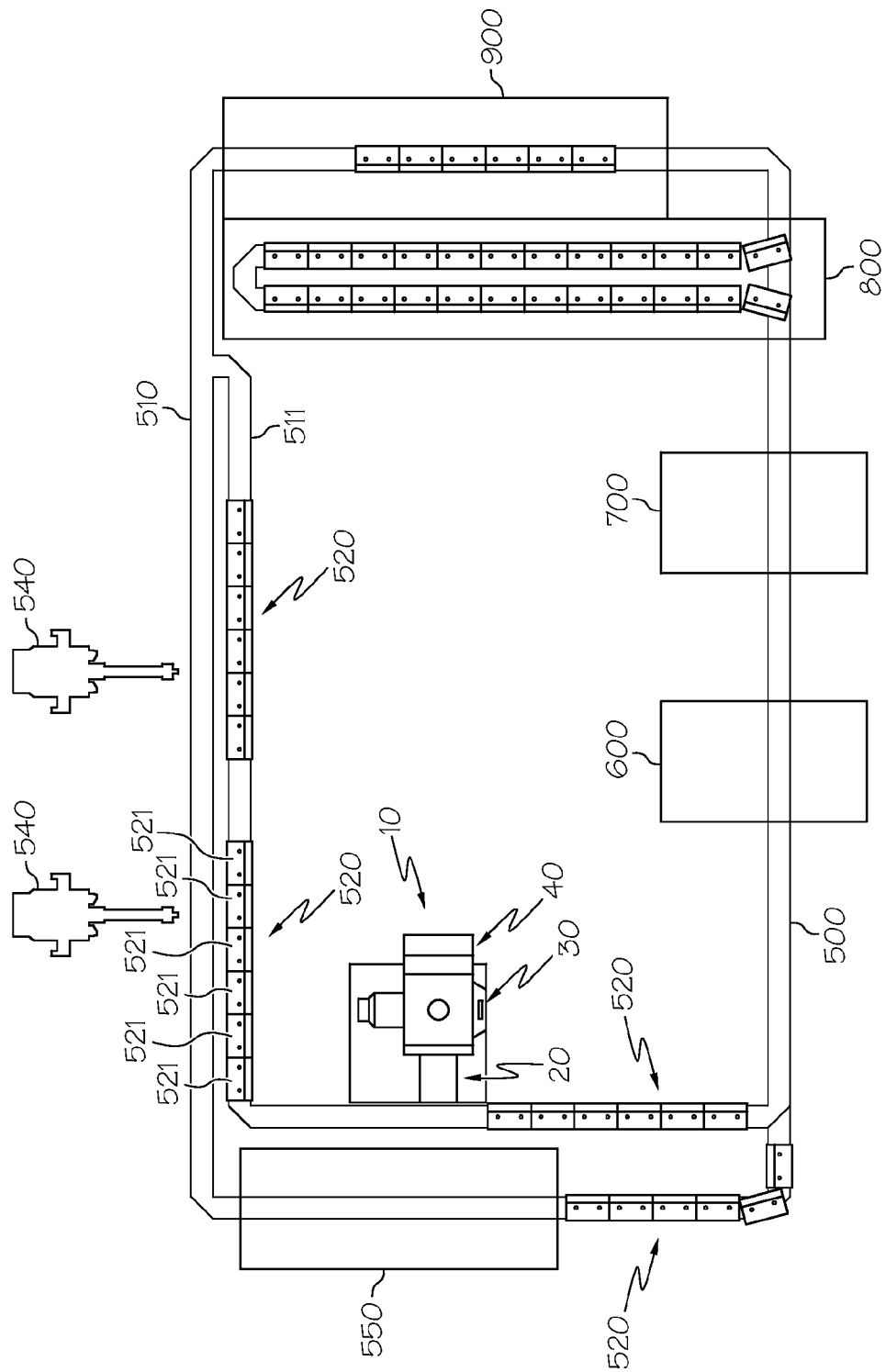
FIG. 5 depicts a schematic of a part-coating conveyor system with an in-line metallizer assembly.

Referring now to FIG. 5, the in-line metallizer assembly 10 (comprising an external rotating actuator exchange 20, vacuum chamber 30 and integrated sputter coater 40) can be utilized along a part-coating conveyor system 1000. The part-coating conveyor system 1000 can comprise a single system operable to apply a basecoat, metalized coat and topcoat using asynchronous pallets. Specifically, the part-coating conveyor system 1000 can comprise a track 500, a basecoat station 600, an in-line metallizer assembly 10, a topcoat station 700 and one or more process stations. Process stations can comprise any other station operable to assist in the application of coatings to the surface of parts. For example, process stations can include a surface treatment station 550, a flash oven station 800 and/or a cure station 900. The track 500 may comprise any type of conveyor system operable to transport a plurality of pallets 521. For example, the track can comprise a plurality of tracks with transitions and guides there between, a path for motorized pallets to travel across, or any alternative system. In one embodiment, such as that illustrated in FIG. 5, the track 500 may specifically comprise a main track 510 and a supplemental track 511. The supplemental track 511 may combine with the main track 510 to allow for two possible paths to arrive at the same destination. By providing two different paths, pallets may be directed down particular path based on the stations the pallet has already visited. In another embodiment, the track 500 may comprise a single continuous track operable to transition pallets sequentially from station to station. It should be appreciated that any other configuration may be employed to allow pallets to travel between stations.

The surface treatment station 550 may comprise any station to prepare or treat the surface of a part before, between or after undergoing coating and/or metallizing applications. For example, in one embodiment, the surface treatment station 550 may comprise a blow off station operable to blow off unwanted debris, excess paint, or any other material that may inadvertently be present. In another embodiment, the surface treatment station 550 may additional or alternatively comprise a mechanical brush or plasma applier. The basecoat station 600 and topcoat station 700 may comprise any stations operable to apply a basecoat and a topcoat of paint to a plurality of parts. As described above, the basecoat station 600 and topcoat station 700 can comprise one or more spray guns that are either fixed or moveable. The one or more spray guns may thereby apply paint to the surface of the parts as the parts travel through the basecoat station 600 and/or the topcoat station 700. The basecoat station 600 and the topcoat station 700 may comprise distinct stations, or, in the alternative, may comprise a single station operable to apply a basecoat and a topcoat independent of the other. The flash oven station 800 may comprise any station operable to help remove solvent from a recently applied paint (e.g., the basecoat or the topcoat). In one embodiment, the flash oven station 800 may comprise an infrared oven. In another embodiment, the flash oven station 800 may comprise a convective oven. It should be appreciated that the flash oven station 800 may comprise any other type of oven either alternatively or additionally such that it is operable to remove solvent from parts. Finally, the cure station 900 may comprise any station operable to cure paint recently applied to a part (e.g., the basecoat or the topcoat). The cure station 900 may comprise any combination of length and temperature to enable the curing of UV paints. In one embodiment, the cure station may comprise a UV cure station where UV light is applied to assist in the curing of the paint. It should further be appreciated that any other types of cure stations may be employed, either alternatively or additionally, to help cure the paint applied to a part.

In one embodiment, the part-coating system 1000 can further comprise a part molder operable to create the original parts. The part molder can comprise any machine operable to produce plastic parts, such as, for example, an injection molding machine. In such an embodiment, the part molder may be integrated with the track 500 such that parts produced from the part molder can directly travel along the track 500 to the basecoat station 600, the metallizer assembly 10, the topcoat station and/or any process station. Such an embodiment may allow for parts to forgo receiving basecoats by reducing the waiting time before being metalized or receiving a topcoat (and thereby reducing the chances the surface of the parts are scratched or otherwise damaged).

Still referring to FIG. 5, the track 500 can further comprise pallets 521 staged in asynchronous groups. Asynchronous groups 520 can comprise a single pallet 521 (such that each group is just a single pallet 521), a set number of pallets 521 (such that each asynchronous group 520 comprises the same set number of pallets 521), or any independent number of pallets 521 (such that each asynchronous group 520 can comprise any number of pallets 521 independent from one another). Asynchronous groups are groups that can travel along the track 500 independent of one another. For example, as opposed to a "chain-on-edge conveyor" (i.e., a conveyor in which all parts are transported by a continuous chain such that each part starts and stops in synch), asynchronous pallets on the track 500 can start and stop independent of one another. In such an embodiment, the movement and direction of each asynchronous group 520 of pallets 521 can be achieved through the use of RFID tags, scanners, flags, electrical signals, machine logic part mapping or any other alternative method for tracking the status of parts to direct them to subsequent stations.

In operation, one or more parts are loaded into pallets 521 on the track 500 via one or more loaders 540. The one or more loaders 540 can comprise any combination of manual or automatic loaders operable to load and unload parts, part carriers and/or pallets onto the track 500. The pallets 521 are arranged in asynchronous groups 520 where each pallet 521 in the asynchronous group 520 holds parts that are at a common stage (such as no paint, base coat only, base coat and metalized coat or all coats). An asynchronous group 520 of pallets 521 with newly molded parts (i.e., no paint coatings) may first be directed to the surface treatment station 550 to blow off unwanted debris left over from initial manufacturing, or otherwise be treated to improve adhesion such as through the use of flames, corona or other type of plasma. The asynchronous group 520 of pallets 521 is then directed through the basecoat station 600 where an initial base coat (e.g., a primer coat) is applied. The base coat can help fill in surface defects left over from manufacturing as well as provide durability and color. After the asynchronous group 520 of pallets 521 passes through the basecoat station 600, it is directed to the flash oven station 800 and/or cure station 900 so that the basecoat can set. It should be noted that where the basecoat station 600 and topcoat station 700 are two separate stations in the same track line (as illustrated in FIG. 5), the asynchronous group 520 of pallets 521 could pass through the topcoat station without actually stopping to receive the topcoat application. Depending on the desired treatment, the asynchronous group 520 of pallets 521 can return to the basecoat station 600 to receive additional basecoats such that the parts are coated with a plurality of basecoats (such as a primer coat and a first coat of base paint). In the alternative, asynchronous group 520 of pallets 521 may independently bypass the basecoat station 600 such as where parts are freshly manufactured and have not acquired surface abrasions, scratches or other defects.

After completion and setting of the basecoat, the asynchronous group 520 of pallets 521 would then be directed to the in-line metallizer assembly 10. The external rotating actuator exchange 20 of the in-line metallizer assembly 10 may thereby continuously pickup the parts from the pallets 521 (either individually or via part carriers) for metallizing while also returning the metalized parts to pallets 521. The in-line metallizer assembly 10 can thereby alleviate the need to collect and remove large batches of parts to be metalized when employing a batch metallizer. Once the parts of the asynchronous group 520 of pallets 521 are all metalized, the asynchronous group 520 of pallets 521 is directed to the topcoat station 700 (potentially via passing through the basecoat station 600 without actually receiving a basecoat). After receiving a topcoat from the topcoat station 700, the asynchronous group 520 of pallets 521 is directed to the flash oven station 800 and cure station 900. Finally, the completed products in the asynchronous group 520 of pallets 521 may be removed from the track 500 by the manual or automatic loaders 540.

Where a particular machine or part breaks down thereby stopping part of the part-coating conveyor system 1000, asynchronous groups 520 of pallets 521 with partially completed parts may continue on where operable. For example, if the basecoat station 600 breaks down, new asynchronous groups 520 of pallets 521 cannot receive a basecoat of paint. However, asynchronous groups 520 of pallets 521 that have already passed through the basecoat station 600 can nonetheless continue through the application cycle since the entire track 500 is not stopped. Unlike chain-on-edge configurations, the asynchronous groups 520 help ensure parts that have received one or more coats of paint can be finalized without excessive downtime, which in turn can decrease the number of parts lost to quality control.

Figure 6:
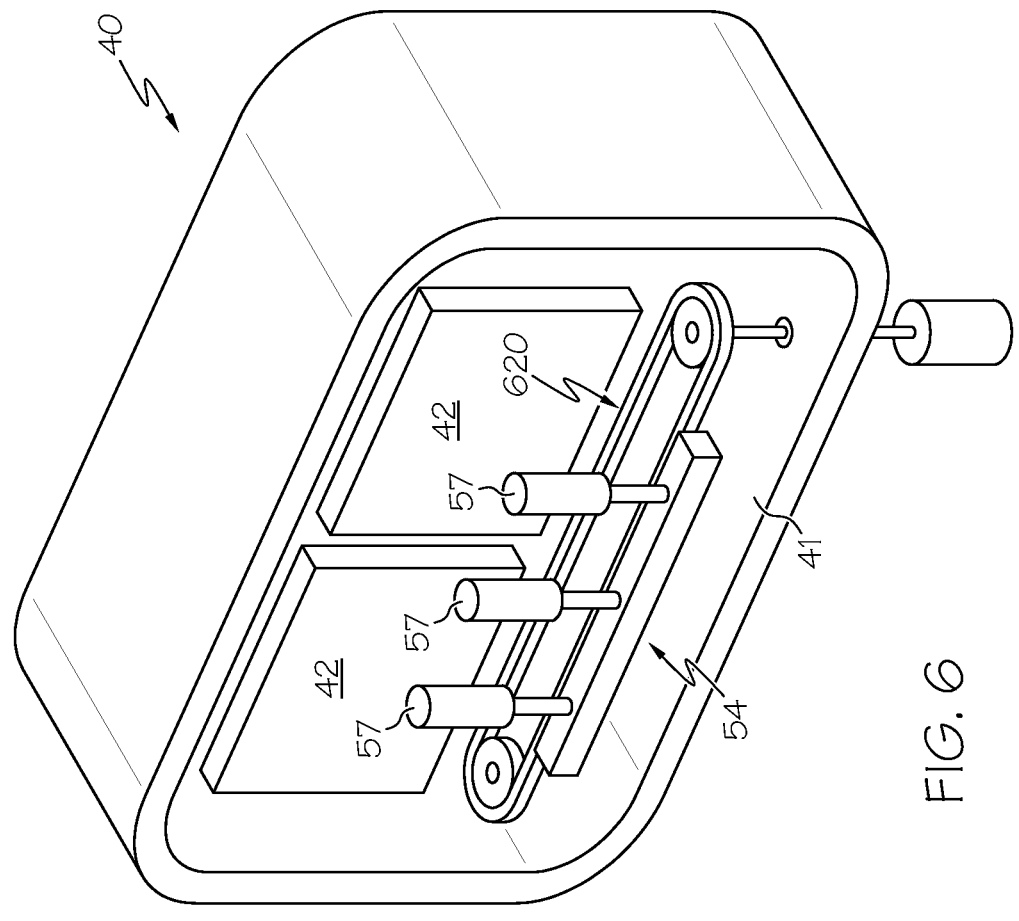
FIG. 6 depicts a side perspective view of a sputter coater of an in-line metallizer assembly according to one or more embodiments shown and described herein.

Referring now to FIG. 6, a portion of the in-line metallizer assembly 10 is depicted. In this embodiment, the sputter coater 40 of the in-line metallizer assembly 10 is depicted with certain components, including the vacuum chamber 30 and the internal rotating pivot 31, removed for clarity. As depicted in FIG. 6, individual parts 57 are positioned on the plurality of rotatable pin fixtures 58 of the part carriers 54. As described hereinabove, the part carriers 54 are introduced to the sputter coater 40 as to position the individual parts 57 proximate to the cathodes 42 to complete the metallization process on the individual parts 57.

Figure 7:
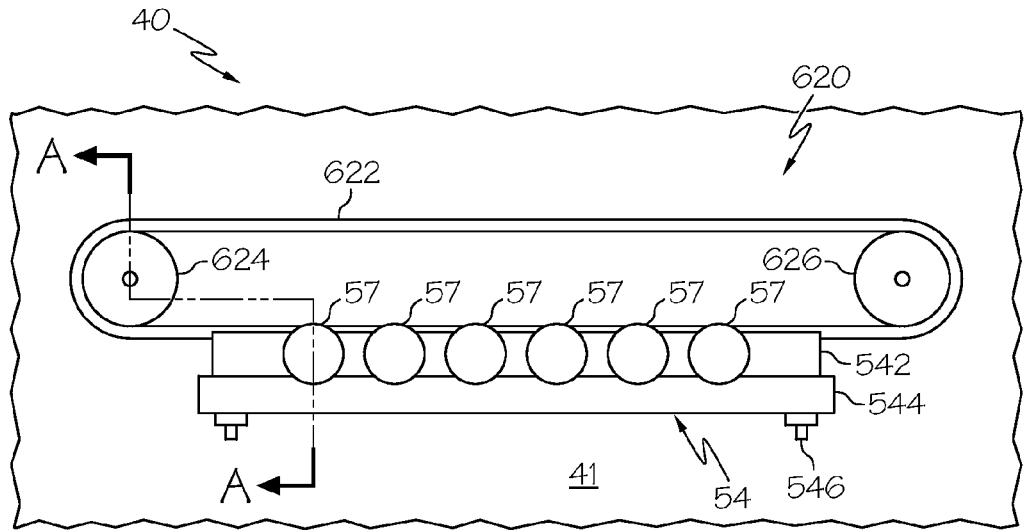
FIG. 7 depicts a top view of a part carrier on which individual parts are arranged as positioned in a sputter coater according to one or more embodiments shown and described herein.
Figure 8:
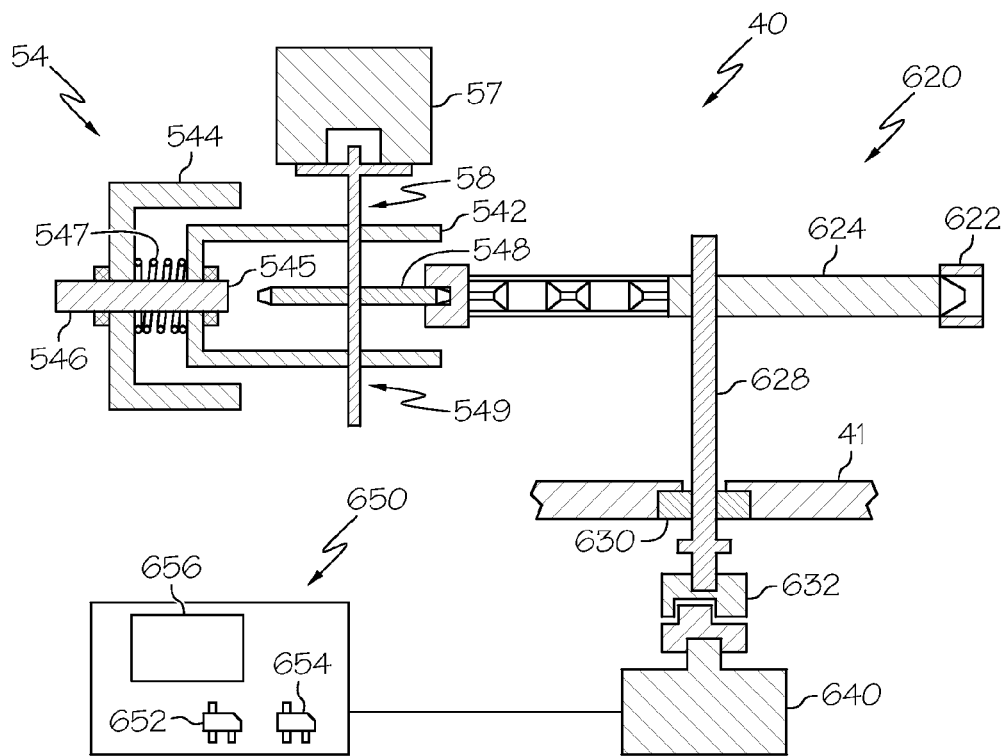
FIG. 8 depicts a side sectional view of the part carrier positioned in the sputter coater along line A-A of FIG. 7.

The in-line metallizer 10 also includes a rotation mechanism 620, which is shown in greater detail in FIGS. 7 and 8. Referring to FIG. 7, the rotation mechanism 620 includes a continuous drive element 622 that is arranged around a first drive gear 624 and a second drive gear 626. The continuous drive element 622 may take a variety of forms including, for example and without limitation, a drive chain or a belt. The first drive gear 624 and the second drive gear 626 may be spaced apart from one another as to adjust the tension on the continuous drive element 622. Alternatively, or in addition, the rotation mechanism 620 may include a tensioning gear (not shown) that maintains tension on the continuous drive element 622.

Referring now to FIG. 8, the in-line metallizer 10 also includes a drive shaft 628 that extends through the sputter coater wall 41 of the sputter coater 40. The drive shaft 628 is coupled to one of the first drive gear 624 or the second drive gear 626 of the rotation mechanism 620. Rotation of the drive shaft 628, therefore, directly controls rotation of one of the first drive gear 624 or the second drive gear 626 and controls translation of the continuous drive element 622 around the first and second drive gears 624, 626. The in-line metallizer 10 also includes a rotary feed-through 630 which is coupled to the sputter coater wall 41 of the sputter coater 40. The rotary feed-through 630 allows the drive shaft 628 to pass through the sputter coater wall 41, while maintaining a fluid-tight seal between the sputter coater wall 41 and the drive shaft 628 such that at a vacuum can be pulled inside the sputter coater 40.

As further depicted in FIG. 8, the in-line metallizer 10 further includes a rotation drive 640 positioned outside of the sputter coater 40 and coupled to the drive shaft 628. The rotation drive 640 may take a variety of forms including, for example and without limitation, an electric motor or a servo motor. As depicted in FIG. 8, the rotation drive 640 and the drive shaft 628 are separated by a flexible coupling 632, which are conventionally known. The flexible coupling 632 allows for misalignment between the drive shaft 628 and the rotation drive 640 while minimizing the introduction of any misalignment force into the drive shaft 628. Reducing misalignment force into the drive shaft 628 may reduce the likelihood of loss of a fluid tight seal between the drive shaft 628 and the sputter coater walls 41 at the rotary feed-through 630. The in-line metallizer 10 may also incorporate transmission (not shown) arranged between the rotation drive 640 and the drive shaft 628 to increase or decrease the rate of rotation of the drive shaft 628 as compared to the rotation drive 640. In some embodiments, a transmission may be incorporated integrally into the rotation drive 640.

The in-line metallizer 10 also includes an electronic controller 650 communicatively coupled to rotation drive 640. The electronic controller 650 includes a processor 652 and a memory 654 electrically coupled to the processor 652. A computer readable instruction set is stored in the memory 654 and is executed by the processor 652 to provide the rotation drive with instructions to rotate or to hold position. The electronic controller 650 may include a graphical display 656 that displays operating parameters of the rotation mechanism 620 and/or the rotation drive 640 to a user. The graphical display 656 may allow a user to make inputs to the electronic controller 650 to modify operation of the rotation drive, for example to change the rate of rotation of the rotation drive 640.

Still referring to FIG. 8, the part carriers 54 are shown in greater detail. In the embodiment depicted in FIG. 8, the part carrier 54 includes a support frame 542 and a lifting body 544. The support frame 542 includes a plurality of rotatable pin fixtures 58 which are positioned spaced apart from one another along the support frame 542. The rotatable pin fixtures 58 include a support shaft 549 that extends through openings in the support frame 542, and a fixture gear 548 rotatationally coupled to the support shaft 549. The fixture gear 548 and the support shaft 549 rotate together with respect to the support frame 542 of the part carrier 54. In some embodiments, the part carrier 54 may include a plurality of bearing elements (not shown) which position the support shafts 549 relative to the support frame 542 and minimize friction between the support shafts 549 and the support frame 542.

In the embodiment depicted in FIG. 8, the support frame 542 of the part carrier 54 is spaced apart from the lifting body 544 with a biasing element 546. In the embodiment depicted in FIG. 8, the biasing element 546 includes a pin 545 that is adapted to slide relative to at least one of the support frame 542 or the lifting body 544, and a spring 547. The spring 547 applies a force to both the support frame 542 and the lifting body 544 in an orientation that tends to separate the support frame 542 from the lifting body 544.

As discussed hereinabove, individual parts 57 are loaded onto the part carriers 54 and are introduced into the sputter coater 40 for completion of a metallizing operation. In regard to the embodiments of the in-line metallizer 10 depicted in FIG. 8, one of the internal door clasps 37, 38 (see FIG. 1) interfaces with the lifting body 544 of the part carrier 54 and positions the part carrier 54 within the sputter coater 40. As the part carrier 54 is rotated into position in the sputter coater 40 by the rotating actuator exchange 35 (see FIG. 1), the fixture gear 548 of the rotatable pin fixture 58 interfaces with the continuous drive element 622 of the rotation mechanism 620. The gear profiles of the fixture gear 548 interface with the continuous drive element 622 such that the continuous drive element 622 controls rotation of the fixture gear 548, and therefore the rotatable pin fixture 58 and the individual part 57 positioned on the rotatable pin fixture 58. As the part carrier 54 is moved into position in the sputter coater 40, the continuous drive element 622 may apply a force to the fixture gears 548. This force may tend to maintain engagement of the fixture gears 548 with the continuous drive element 622. Further, because of tolerance variations between the part carriers 54 and variation in the relative positioning of the fixture gears 548 and the continuous drive element 622, some variation in the positioning of the part carrier 54 and the continuous drive element 622 may be expected. To accommodate this variation in positioning between the part carrier 54 and the continuous drive element 622, the support frame 542 of the part carrier 54 may compress the biasing element 546 and be repositioned towards the lifting body 544. By allowing the support frame 542 to be repositioned with respect to the lifting body 544, variation in spacing between the fixture gears 548 and the continuous drive element 622 can be accommodated by the part carrier 54.

Referring again to FIG. 6, the individual parts 57 are introduced to the sputter coater 40 and positioned proximate to the cathodes 42 for completion of the metallizing operation. In some embodiments of the in-line metallizer assembly 10, the rotation mechanism 620 causes the rotatable pin fixtures 58, and therefore the individual parts 57, to rotate continuously during the metallizing operation such that the fixed-position cathodes 42 metalize all of the surfaces of the individual parts 57 having line-of-sight access to the cathodes 42. By rotating the individual parts 57 during the metallizing operation, a continuous metalized layer can be applied to the individual parts 57. In other embodiments of the in-line metallizer assembly 10, the rotation mechanism 620 limits rotation of the rotatable pin fixtures 58, and therefore the individual parts 57, during the metallizing operation such that only those limited surfaces of the individual parts 57 with line-of sight-access to the cathodes 42 are metalized. Such embodiments of the in-line metallizer assembly 10 may incorporate a servo motor or a stepper motor as the rotation device 640 such that rotation of the rotatable pin fixtures 58 can be minimized and/or eliminated. Orientation of the individual parts 57 relative to the cathodes 42 allow for complete or partial metallization of the individual parts 57, as dictated by a particular design.

As discussed hereinabove, embodiments of the in-line metallizer assembly 10 include an electronic controller 650 that control operation of the rotation device 640 such that the rotation device 640, and therefore the continuous drive element 620, the rotatable pin fixtures 58, and the individual parts 57 rotate at the desired rate of rotation and/or is positioned at the desired angular orientation relative to the cathodes 42. The electronic controller 650 may execute the computer readable instruction that commands the desired response from the rotation device 640. Alternatively or in addition, a user may intervene as to modify operation of the rotation device 640 such that the rotation device 640 conforms to the desired operation for a particular metallizing operation. Further, properties of the metallization operation including process gas type, process gas flow rate, chamber vacuum pressure, individual part orientation, individual part position, and individual part rate of rotation may be controlled by the electronic controller 650 to allow for repeatable processing across a plurality of individual parts 57 and part setups. As such, consistent part manufacture may be achieved across separate processing batches.

Figure 9:
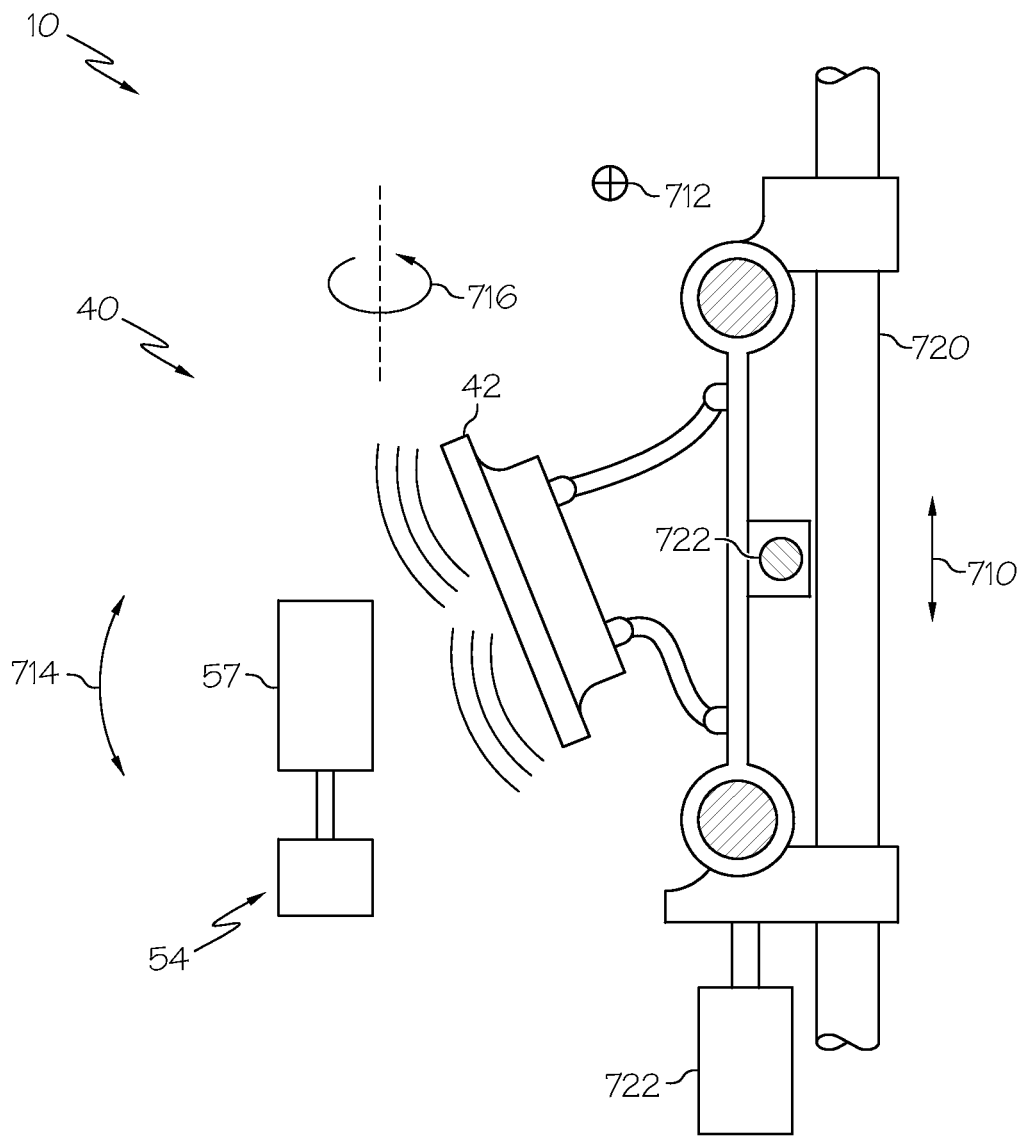
FIG. 9 depicts a side view of components of a sputter coater having a repositionable cathode according to one or more embodiments shown and described herein.

Referring now to FIG. 9, components of another embodiment of the in-line metallizer assembly 10 are depicted. In this embodiment, components positioned within the sputter coater 40 are depicted. In this embodiment, the cathode 42 that metalizes the individual components 57 is repositionable in a vertical direction 710 and a horizontal direction 712, and is tiltable in a vertical orientation 714 as well as a horizontal orientation 716. In the embodiment depicted in FIG. 9, the cathode 42 is coupled to a cathode frame 720 positioned within the sputter coater 40. The cathode frame 720 depicted in FIG. 9 allows the cathode 42 to be adjusted in the directions of freedom of movement (i.e., the vertical direction 710, the horizontal direction 712, the vertical orientation 714, and the horizontal orientation 716) independently of one another, such that the cathode 42 can be positioned to provide the desired line-of-sight access to the individual parts 57. In the embodiment depicted in FIG. 9, the in-line metallizer assembly 10 further includes cathode drive mechanisms 722 that modifies the position of the cathode 42 along the cathode frame 720 or the orientation of the cathode 42 relative to the cathode frame 720.

In some embodiments of the in-line metallizer assembly 10, the cathode drive mechanisms 722 may be linear-acting servo motors that directly translate the cathode 42 in the vertical direction 710 or the horizontal direction 712. Similarly, the cathode drive mechanisms 722 may be rotary-acting servo motors that tilt the cathode 42 in the vertical orientation 714 or the horizontal orientation 716. Alternatively or in addition, the cathode drive mechanism 722 may include a remote tracking apparatus (not shown) similar to rotation mechanism 620 described above and depicted in FIGS. 6-8.

Incorporation of a remote tracking apparatus with the cathode frame 720 may allow for the cathode drive mechanisms 722 to be positioned remotely from the sputter coater 40.

Similar to the rotation device 640 described hereinabove, the cathode drive mechanisms 722 may be coupled to the electronic controller 650. The electronic controller 650 executes the computer readable instruction set and selectively commands the cathode drive mechanisms 722 to tilt and/or translate the cathode in at least one directions of freedom of movement (i.e., the vertical direction 710, the horizontal direction 712, the vertical orientation 714, and the horizontal orientation 716) relative to the cathode frame 720 as to control the angular orientation and/or positional location of the cathode 42 within the sputter coater 40.

In one embodiment, the cathode frame 720 may be oriented in a planar orientation or a non-planar orientation, where the cathode 42 follows along the cathode frame 720. In one embodiment, the cathode frame 720 may be arched such that the cathode 42 moves in both the vertical direction 710 and the horizontal direction 712 when the cathode 42 is translated along the cathode frame 720.

While the embodiment of the in-line metallizer assembly 10 depicted in FIG. 9 includes a single cathode 42, it should be understood that the in-line metallizer assembly 10 may include a plurality of cathodes 42 arranged within the sputter coater 40, where each cathode 42 may be oriented to deliver sputter coating to the surfaces of the part.

Figure 10:
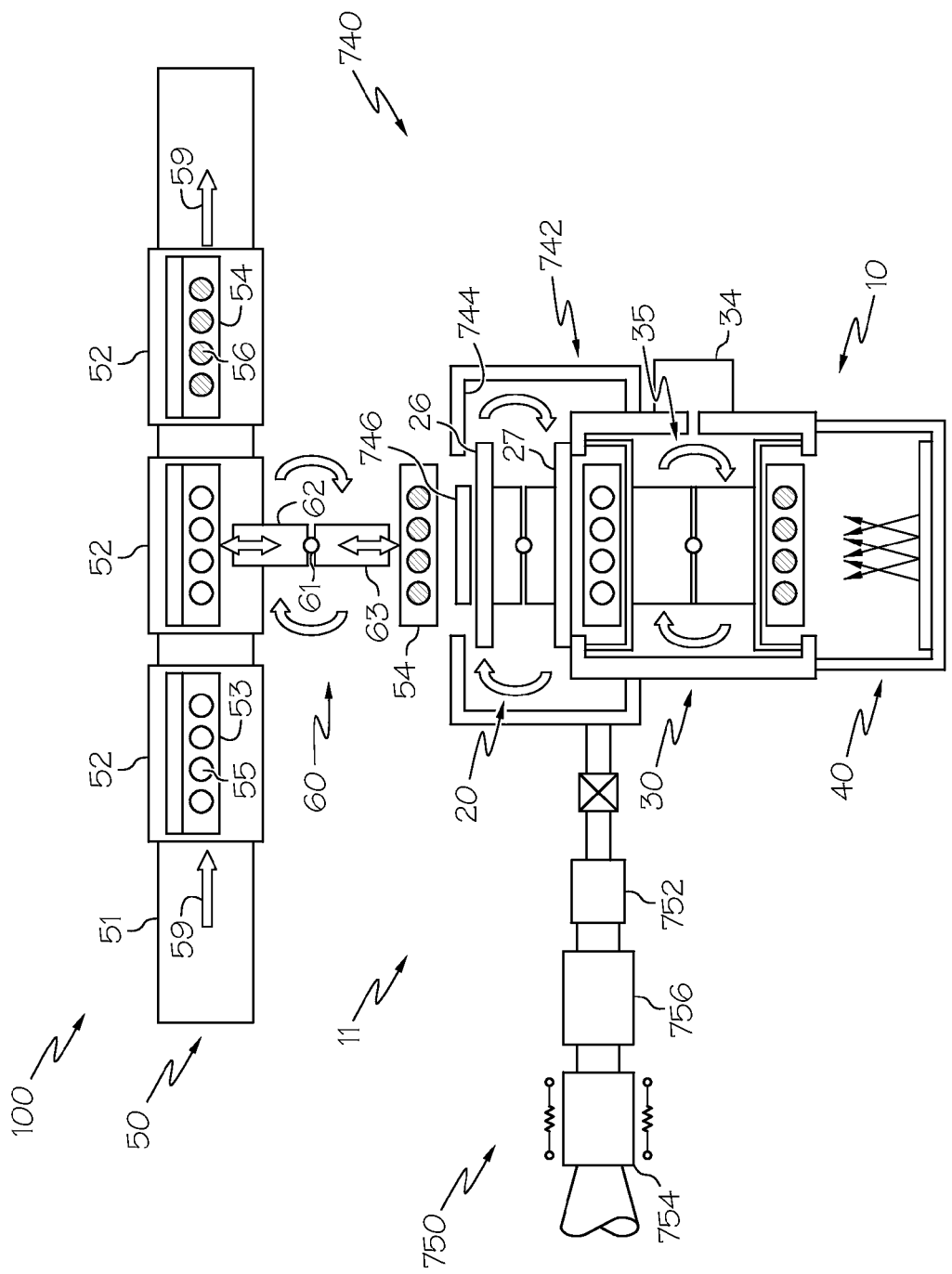
FIG. 10 depicts a side view of components of an in-line metallizer assembly according to one or more embodiments shown and described herein.

Referring now to FIG. 10, portions of another embodiment of the in-line metallizer assembly 10 is depicted. In this embodiment, the in-line metallizer assembly 10 includes a buffer gas system 740 that is positioned proximate to the external rotating actuator exchange 20 and the vacuum chamber 30. The buffer gas system 740 includes an enclosure 742 that is positioned to at least partially enclose the vacuum chamber 30 and the external rotating actuator exchange 20. The endwall 744 of the enclosure 742 may be positioned such that the first and second external door clasps 26,27 selectively form a temporary seal with the endwall 744 of the enclosure 742 when the respective first or second external door clasp 26,27 is positioned in an extended position. At least a portion of the external rotating actuator exchange 20 may extend through an opening in the enclosure 742, thereby allowing the external rotating actuator exchange 20 to exchange parts between the conveyor system 50 and the internal rotating actuator exchange 35.

The buffer gas system 740 also includes a pressurized gas delivery system 750 that is plumbed to the enclosure 742 and provides the enclosure 742 with gas at a pressure greater than the ambient pressure outside of the enclosure 742. As used herein, the gas introduced to the enclosure 742 may be any gas including, for example and without limitation, air, oxygen, nitrogen, helium, argon, neon, and the like. In one embodiment, the pressurized gas delivery system 750 includes a desiccation device 752 that reduces the humidity of gas passing through the pressurized gas delivery system 750 into the enclosure 742. In some embodiments, the pressurized gas delivery system 750 may further include a temperature conditioning device 754 that adjusts the temperature of the gas directed into the enclosure 742 and a filtration device 756 that captures particulates from the gas before the gas is directed into the enclosure 742. The buffer gas system 740 may also include a gas knife 746 positioned within the enclosure 742 and supplied with pressurized buffer gas from the gas delivery system 750. The gas knife 746 directs a curtain of pressurized buffer gas in a generally planar orientation.

Pressurized buffer gas is delivered to the enclosure 742 such that buffer gas generally fills the enclosure 742. Because the pressurized buffer gas is maintained at a pressure above ambient within the enclosure 742, the buffer gas flows out into the surrounding environment and limits ingestion of untreated environmental air into the enclosure 742. Introduction of contaminants such as dust and moisture to the vacuum chamber 30 and the sputter coater 40 may negatively impact the metallizing process on pre-metalized parts 55 by the sputter coater 40. Reducing ingestion of untreated environmental air that carries such contaminants into the enclosure 742, reduced the likelihood of ingestion of untreated environmental air into the vacuum chamber 30 and the sputter coater 40 as the part carriers 54 are moved for sputter coating the pre-metalized parts 55, as discussed hereinabove. In particular, pressurized buffer gas may be introduced to the enclosure 742 at a rate greater than gas enters the vacuum chamber 30 during the exchange of part holders 54 and parts 55 by the external rotating actuator exchange 20.

Because of the short cycle time in which the parts 55 are metalized, the vacuum pumps 34 that evacuate gas from the vacuum chamber 30 and the sputter coater 40 may have difficulty in removing gas that is introduced to the vacuum chamber 30 and the sputter coater 40 during the part carrier 54 exchanges within one cycle of operation of the sputter coater 40. Further, any condensation that is introduced to the vacuum chamber 30 and the sputter coater 40 may tend to collect along surfaces of the vacuum chamber 30 and the sputter coater 40, increasing the difficulty of removing the moisture from the vacuum chamber 30 and the sputter coater 40. Therefore, by flooding the enclosure 742 with pressurized buffer gas from the pressurized gas delivery system 750, ingestion of contaminants into the enclosure 742, and therefore the vacuum chamber 30 and the sputter coater 40, may be reduced. Accordingly, in-line metallizer assembly 10 that incorporate a buffer gas system 740 may increase the yield of metalized parts 56 produced.

As depicted in FIG. 10, the gas knife 746 is positioned within the enclosure 742 proximate to the opening through which the external rotating actuator exchange 20 exchanges parts along the conveyor system 50. As discussed hereinabove, the gas knife 746 is provided with pressurized buffer gas that is ejected from the gas knife 746 in a generally planar orientation, such that the gas knife 746 forms a "gas curtain." The gas knife 746 may include a flow tube that is perforated with a plurality of holes or slots that direct passage of pressurized buffer gas. By positioning the gas knife 746 such that the pre-metalized parts 55 pass through the gas curtain as the part carriers 54 are exchanged, the gas knife 746 may direct pressurized buffer gas onto the pre-metalized parts 55 as to dislodge any contaminants and/or dry any moisture from the pre-metalized parts 55 before the pre-metalized parts 55 are exchanged into the vacuum chamber 30 and the sputter coater 40. Thus, the gas knife 746 further reduces the likelihood of ingestion of contaminants into the vacuum chamber 30.

It should now be appreciated that in-line metallizer assemblies may continuously metalize parts off of a conveyor belt without the need for batch loading/unloading. In-line metallizer can continuously pick up parts from a conveyor belt and swap them with recently metalized parts. The newly picked-up parts may be transferred to a vacuum chamber where they can be metalized and returned. While parts are being metalized inside the vacuum chamber, a new set of pre-metalized parts is picked up and exchanged with the most recently metalized parts. This in-line metallizer assembly may further be combined with an asynchronous part-coating conveyor system to efficiently apply a basecoat, metalized coat and topcoat to a part. The asynchronous grouping of pallets can help ensure partially completed pallets receive their next coats before an undesirable amount of time passes.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An in-line metallizer assembly for sputter coating pre-metalized parts, the in-line metallizer assembly comprising:
   a vacuum chamber;
   a sputter coater in communication with the vacuum chamber and comprising a cathode and a sputter coater wall;
   an internal rotating actuator exchange positioned within the vacuum chamber for exchanging pre-metalized parts into the sputter coater and metalized parts out of the sputter coater, the internal rotating actuator exchange comprising an internal rotating pivot, internal actuating arms that are coupled to the internal rotating pivot and are adapted to extend and retract from the internal rotating pivot, and a first internal door clasp and a second internal door clasp that are each coupled to one of the internal actuating arms;
   a part carrier comprising at least one rotatable pin fixture, a lifting body, a support frame that is spaced apart from the lifting body, and a biasing element comprising a pin that slides relative to at least one of the lifting body or the support frame of the part carrier and spring that applies a force to the lifting body and the support frame, wherein the biasing element may be compressed such that a relative position between the lifting body and the support frame is repositionable along the pin, the part carrier adapted to be moved into and out of the sputter coater by the internal rotating actuator exchange;
   a rotation mechanism positioned within the sputter coater, the rotation mechanism selectively coupled to the at least one rotatable pin fixture, wherein the biasing element maintains contact between the at least one rotatable pin fixture and the rotation mechanism; and
   a drive shaft extending into the sputter coater through the sputter coater wall and coupled to the rotation mechanism for controlling rotation of the at least one rotatable pin fixture.

2. The in-line metallizer assembly of claim 1, further comprising a plurality of rotatable pin fixtures, wherein each rotatable pin fixtures is selectively coupled to the rotation mechanism.

3. The in-line metallizer assembly of claim 1, wherein:
   the rotation mechanism comprises a continuous drive element arranged around a first drive gear and a second drive gear,
   the at least one rotatable pin fixture comprises a fixture gear rotationally coupled to a support shaft, the fixture gear and the support shaft rotate together with respect to the part carrier; and
   the part carrier is selectively positioned within the sputter coater such that the fixture gear meshes with the continuous drive element of the rotation mechanism.

4. The in-line metallizer assembly of claim 1, further comprising a rotation drive that is positioned outside of the vacuum chamber and is coupled to the drive shaft.

5. The in-line metallizer assembly of claim 4, wherein the rotation drive is a servo motor or an electric motor.

6. The in-line metallizer assembly of claim 4, further comprising an electronic controller communicatively coupled to the rotation drive, the electronic controller comprising a processor and a memory electrically coupled to the processor, the memory storing a computer readable instruction set that, when executed by the processor, selectively commands rotation and/or indexed positioning of the rotation drive thereby controlling an angular orientation of the at least one rotatable pin fixture.

7. An in-line metallizer assembly for sputter coating pre-metalized parts, the in-line metallizer assembly comprising:
   a vacuum chamber;
   a sputter coater in communication with the vacuum chamber and comprising a cathode frame positioned within a vacuum chamber and a cathode coupled to the cathode frame;
   an internal rotating actuator exchange positioned within the vacuum chamber for exchanging pre-metalized parts into the sputter coater and metalized parts out of the sputter coater, the internal rotating actuator exchange comprising an internal rotating pivot, internal actuating arms that are coupled to the internal rotating pivot and are adapted to extend and retract from the internal rotating pivot, and a first internal door clasp and a second internal door clasp that are each coupled to one of the internal actuating arms;
   a part carrier comprising at least one rotatable pin fixture, a lifting body, a support frame that is spaced apart from the lifting body, and a biasing element comprising a pin that slides relative to at least one of the lifting body or the support frame of the part carrier and spring that applies a force to the lifting body and the support frame, wherein the biasing element may be compressed such that a relative position between the lifting body and the support frame is repositionable along the pin, the part carrier adapted to be moved into, maintained in position within, and out of the sputter coater by the internal rotating actuator exchange; and
   a rotation mechanism positioned within the sputter coater, the rotation mechanism selectively coupled to the at least one rotatable pin fixture, wherein the biasing element maintains contact between the at least one rotatable pin fixture and the rotation mechanism;
   wherein the cathode has at least one direction of freedom of movement as to be selectively positioned within the sputter coater.

8. The in-line metallizer assembly of claim 7, wherein the at least one direction of freedom of movement allows the cathode to be tilted in a vertical orientation.

9. The in-line metallizer assembly of claim 7, wherein the at least one direction of freedom of movement allows the cathode to be tilted in a horizontal orientation.

10. The in-line metallizer assembly of claim 7, wherein the at least one direction of freedom of movement allows the cathode to be translated in a vertical direction.

11. The in-line metallizer assembly of claim 7, wherein the at least one direction of freedom of movement allows the cathode to be translated in a horizontal direction.

12. The in-line metallizer assembly of claim 7, further comprising a cathode drive mechanism coupled to the cathode and the cathode frame, the cathode drive mechanism modifies the position and/or orientation of the cathode relative to the cathode frame in the at least one direction of freedom of movement.

13. The in-line metallizer assembly of claim 12, wherein the cathode drive mechanism comprises at least one linear servo motor.

14. The in-line metallizer assembly of claim 12, wherein the cathode drive mechanism comprises at least one rotary servo motor.

15. The in-line metallizer assembly of claim 12, further comprising an electronic controller communicatively coupled to the cathode drive mechanism, the electronic controller comprising a processor and a memory electrically coupled to the processor, the memory storing a computer readable instruction set that, when executed by the processor, selectively commands the cathode drive mechanism to tilt and/or translate the cathode in the at least one direction of freedom of movement relative to the cathode frame as to control an angular orientation and/or positional orientation of the cathode within the sputter coater.

16. The in-line metallizer assembly of claim 1, further comprising an external rotating actuator exchange positioned outside of the vacuum chamber and adapted to exchange part carriers into and out of the vacuum chamber, the external rotating actuator exchange comprising an external rotating pivot, external actuating arms that are coupled to the external rotating pivot and are adapted to extend and retract from the external rotating pivot, and a first external door clasp and a second external door clasp that are each coupled to one of the external actuating arms.

17. The in-line metallizer assembly of claim 1, further comprising a rotary feed-through that is coupled to the sputter coater wall of the sputter coater, the rotary feed-through forming a fluid-tight seal between the sputter coater wall and the drive shaft.

* * * * *

UNITED STATES PATENT AND TRADEMARK OFFICE
CERTIFICATE OF CORRECTION

PATENT NO. : 9,051,650 B2
APPLICATION NO. : 13/655912
DATED : June 9, 2015
INVENTOR(S) : Joseph W. Gresik et al.

It is certified that error appears in the above-identified patent and that said Letters Patent is hereby corrected as shown below:

On the Title Page

Item (72) Inventors & Cities
Change "Stanley Brooks; Biddeford, ME (US)" to --Stanton A. Brooks; Peaks Island, ME (US)--
Change "John Shaw; Scarborough, ME (US)" to --John H. Shaw; New Gloucester, ME (US)--

Item (72) Inventor
Change "Larry Zuckerman" to --Lawrence J. Zuckerman--

Signed and Sealed this
Seventeenth Day of November, 2015

Michelle K. Lee
*Director of the United States Patent and Trademark Office*